(12) United States Patent
Lin

(10) Patent No.: US 8,336,203 B2
(45) Date of Patent: Dec. 25, 2012

(54) PRINTED CIRCUIT BOARD AND LAYOUT METHOD THEREOF

(75) Inventor: Yu-Hsu Lin, Santa Clara, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 358 days.

(21) Appl. No.: 12/759,011

(22) Filed: Apr. 13, 2010

(65) Prior Publication Data

US 2011/0127069 A1  Jun. 2, 2011

(30) Foreign Application Priority Data

Dec. 1, 2009 (CN) .......................... 2009 1 0310726

(51) Int. Cl.
*H05K 3/02* (2006.01)
*H05K 3/10* (2006.01)

(52) U.S. Cl. ........................................................ 29/846

(58) Field of Classification Search ............. 29/846–853
See application file for complete search history.

(56) References Cited

U.S. PATENT DOCUMENTS

| 6,865,790 B2 * | 3/2005 | Young et al. ................. 29/426.4 |
| 2009/0133906 A1 * | 5/2009 | Baek ............................. 174/254 |
| 2010/0237961 A1 * | 9/2010 | Pai et al. ........................... 333/4 |

* cited by examiner

*Primary Examiner* — Jeremy Norris
(74) *Attorney, Agent, or Firm* — Altis Law Group, Inc.

(57) ABSTRACT

A printed circuit board layout method includes the following steps. A printed circuit board with a signal layer, and a pair of differential transmission lines positioned on the signal layer is provided. A first distance is determined, when the distance between the pair of differential transmission lines is greater or less than the first distance, an eye width and an eye height of an eye diagram obtained at output terminals of the pair of differential transmission lines increases. A second distance less than the first distance is set between the pair of differential transmission lines which makes the eye width and the eye height meet requirement of the differential transmission lines for the eye diagram.

16 Claims, 5 Drawing Sheets

PRINTED CIRCUIT BOARD AND LAYOUT METHOD THEREOF

BACKGROUND

1. Technical Field

The present disclosure relates to a printed circuit board and layout method thereof that can save layout space on the printed circuit board.

2. Description of Related Art

Printed circuit boards are designed for coupling control chips and electronic devices, to transmit signals such as high-speed differential signals. Mutual capacitance is the coupling of two electric fields. Similarly, if two conductors are in close proximity with each other, a voltage will be generated in the second conductor as a result. This is mutual inductance.

Crosstalk is the electrical "noise" caused by mutual inductance and mutual capacitance between signal conductors, due to the close proximity of the signal conductors to each other. Crosstalk can cause digital system failure due to false signals appearing on a receiver. A typical layout method for reducing the crosstalk is to increase the distance between the two conductors, which occupies extra space and increases the cost.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
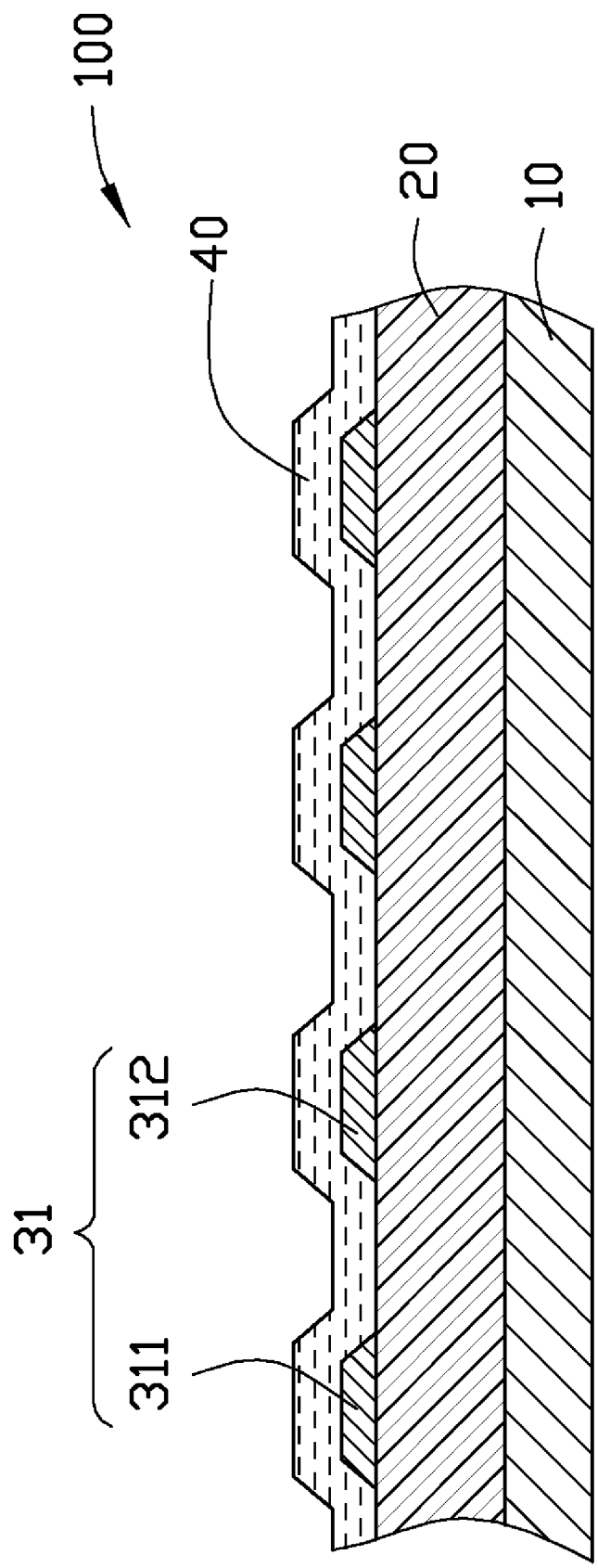
FIG.1 is an isometric view of a printed circuit board, in accordance with one embodiment; the printed circuit board includes at least one pair of differential transmission lines.

Referring to FIG.1, a printed circuit board includes a reference layer 10, a signal layer 20, and a solder mask 40 arrayed in sequence from top to bottom. The signal layer 20 sets at least a pair of differential transmission lines 31 thereon. Each differential transmission line 31 includes a first transmission line 311, and a second transmission line 312. A width of each of the first and second transmission lines 311 and 312 is W. A thickness of each of the first and second transmission lines 311 and 312 is T. A length of each of the first and second transmission lines 311 and 312 is L. A distance between the first and second transmission lines 311 and 312 is S. A distance between a middle of the two differential transmission lines 31 is DS. A thickness of the signal layer 20 is H. A thickness of the solder mask 40 is Tm. In one embodiment, W is 5 mil, T is 1.9 mil, L is 12 inch, S is 7 mil, H is 4.2 mil, and Tm is 0.7 mil. A dielectric constant of the signal layer 20 is 4.1, and a dielectric constant of the solder mask 40 is 3.4. The distance S is a fixed value, which is determined by W, T, H, Tm, and the dielectric constant of the signal layer 20 and solder mask 40. The input terminals of each differential transmission line 31 are electrically coupled to a signal generator (not shown). The output terminals of each differential transmission line 31 are electrically coupled to an oscillograph (not shown). In one embodiment, a data transfer rate of the signal generator is 8 bit per second, a error rate of the oscillograph is 1E-12.

Figure 2:
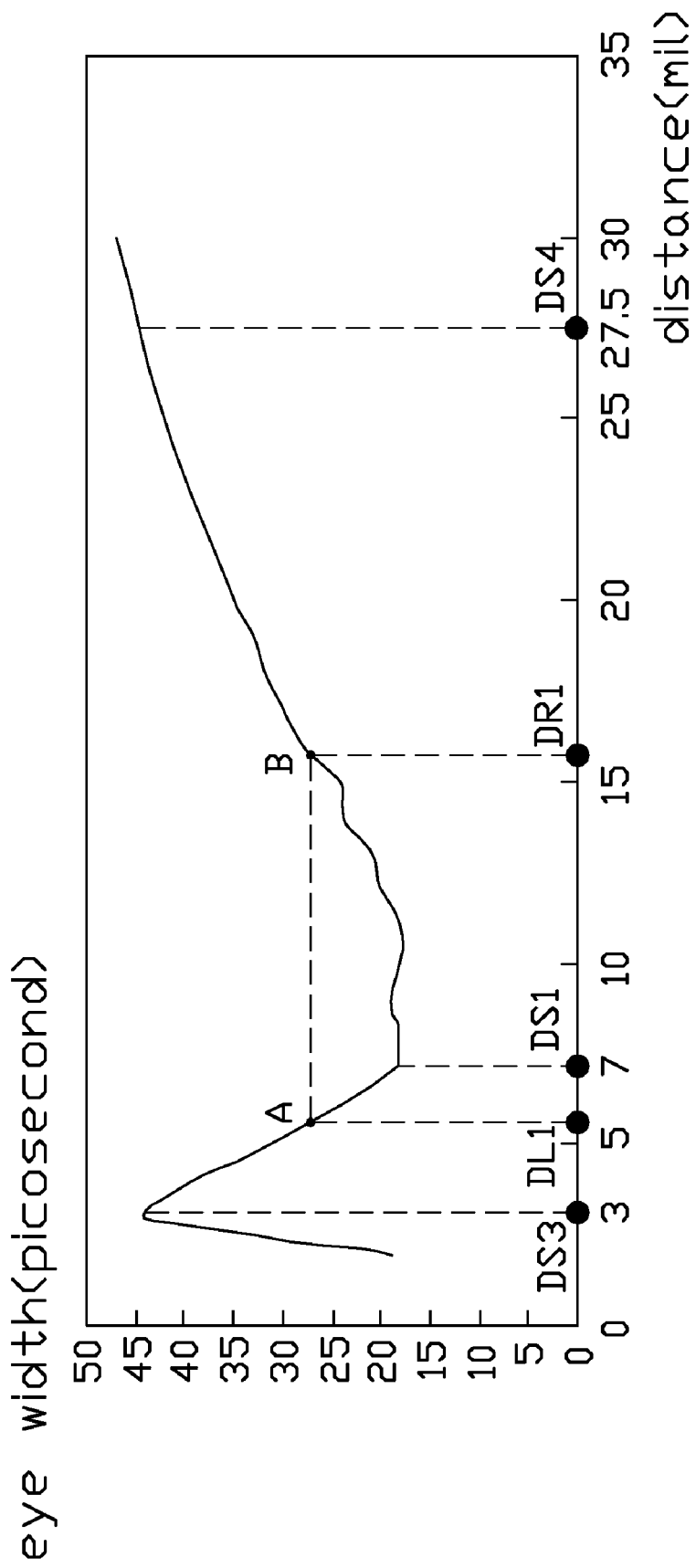
FIG.2 is an oscillographic trace showing a signal waveform of a relationship between the differential transmission lines distance and eye width in eye diagram, in accordance with an embodiment.
Figure 3:
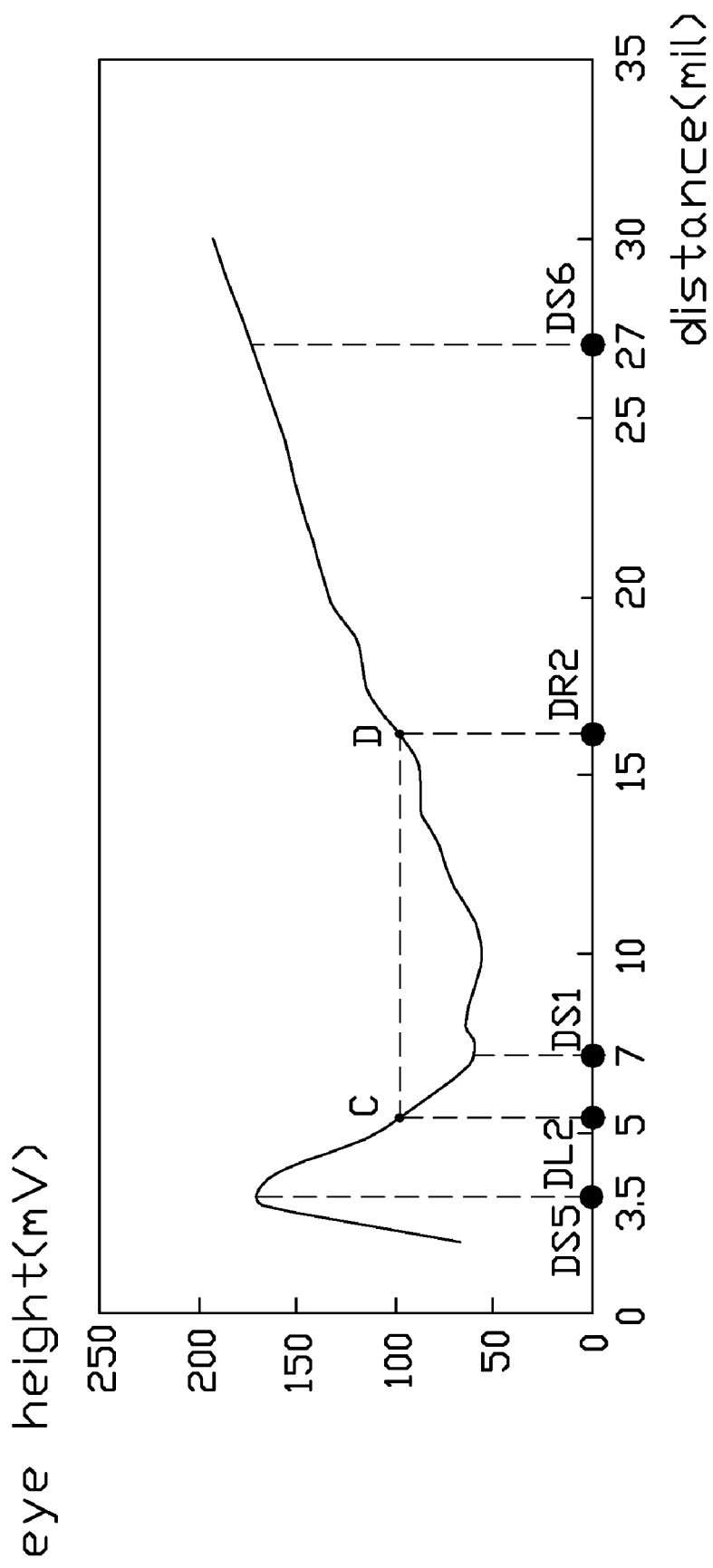
FIG.3 is an oscillographic trace showing a signal waveform of a relationship between the differential transmission lines distance and eye height in eye diagram, in accordance with an embodiment.

Referring to FIGS. 2 and 3, in simulation, the distance DS is changed to obtain a signal waveform of a relationship between the distance DS and eye width in eye diagram as shown in FIG.2, and a signal waveform of a relationship between the distance DS and eye height in eye diagram as shown in FIG.3. Referring to FIG.2, the distance DS is capable of being set to a first distance DS1 which makes an eye width of the eye diagram to reach a minimum value. When the distance DS is greater or less than the first distance DS1, an eye width of the eye diagram increases. The distance DS is further capable of being set to a third distance DS3 less than the first distance DS1, which makes an eye width of the eye diagram reach a maximum value. The distance DS is also capable of being set to a fourth distance DS4 greater than the first distance DS1 corresponding to an eye width equal to the eye width corresponding to the third distance DS3. In one embodiment, the first distance DS1 is 7 mil, the third distance DS3 is 3 mil, and the fourth distance DS4 is 27.5 mil.

The signal waveform is a non symmetric parabola which has a left threshold point A, and a right threshold point B. The left threshold point A corresponds to a left threshold distance DL1 of the distance DS. The right threshold point B corresponds to a right threshold distance DR1 of the distance DS. An eye width of the eye diagram corresponds to where the left threshold point A meets requirements of the differential transmission lines 31 for the eye diagram. An eye width of the eye diagram corresponds to where the right threshold point B meets requirements of the differential transmission lines 31 for the eye diagram. Eye widths of the eye diagram correspond to the other points between the left and right threshold points A and B do not meet requirements of the differential transmission lines 31 for the eye diagram. Therefore, the distance DS is set as a second distance less than or equal to the left threshold distance DL1, or greater than or equal to the third distance DS3. In a typical layout method, the distance DS increases to, the fourth distance DS4 to increase the eye width. The simulation according to the set conditions shows that the layout space can be saved when the distance DS is set as the second distance. For example, when the third distance DS3 is set as the distance DS, a 24.5 mil layout space can be saved.

Referring to FIG.3, the distance DS is further capable of being set to a fifth distance DS5 less than the first distance DS1 which makes an eye height of the eye diagram to reach a maximum value. The distance DS is also capable of being set to a sixth distance DS6 greater than the first distance DS1 corresponding to an eye height equal to the eye height corresponding to the fifth distance DS5. In one embodiment, the fifth distance DS5 is 3.5 mil, and the sixth distance DS6 is 27 mil.

The signal waveform has a left threshold point C, and a right threshold point D. The left threshold point C corresponds to a left threshold distance DL2 of the distance DS. The right threshold point D corresponds to a right threshold distance DR2 of the distance DS. An eye height of the eye diagram corresponds to the left threshold point C meets a requirement of the differential transmission lines 31 for the eye diagram. An eye height of the eye diagram corresponds to the right threshold point D meets a requirement of the differential transmission lines 31 for the eye diagram. Eye heights of the eye diagram correspond to the other points between the left and right threshold points C and D do not meet the requirements of the differential transmission lines 31 for the eye diagram. Therefore, the distance DS is set as a second distance less than or equal to the left threshold distance DL2, or greater than or equal to the fifth distance DS5. In a typical layout method, the distance DS increases to, the sixth distance DS6 to increase the eye height. The simulation according to the set conditions shows that the layout space can be saved when the distance DS is set as the second distance. For example, when the fifth distance DS5 is set as the distance DS, a 23.5 mil layout space can be saved.

Usually a second distance corresponding to the eye width is equal to that of the eye height. When a first second distance corresponding to the eye width is not equal to a second second distance corresponding to the eye height, the greater one of the first and second second distances is set as the second distance.

Figure 4:
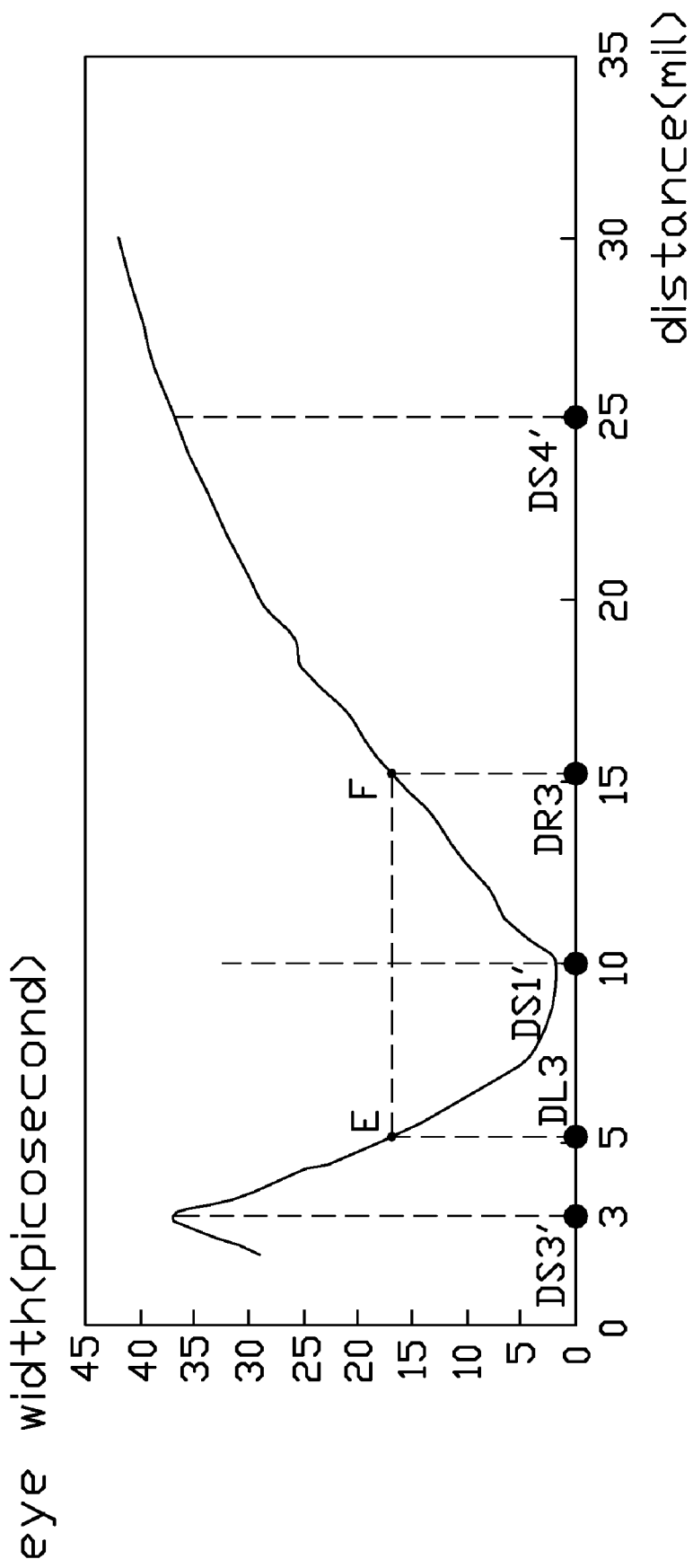
FIG.4 is an oscillographic trace showing a signal waveform of a relationship between the differential transmission lines distance and eye width in eye diagram, in accordance with another embodiment.
Figure 5:
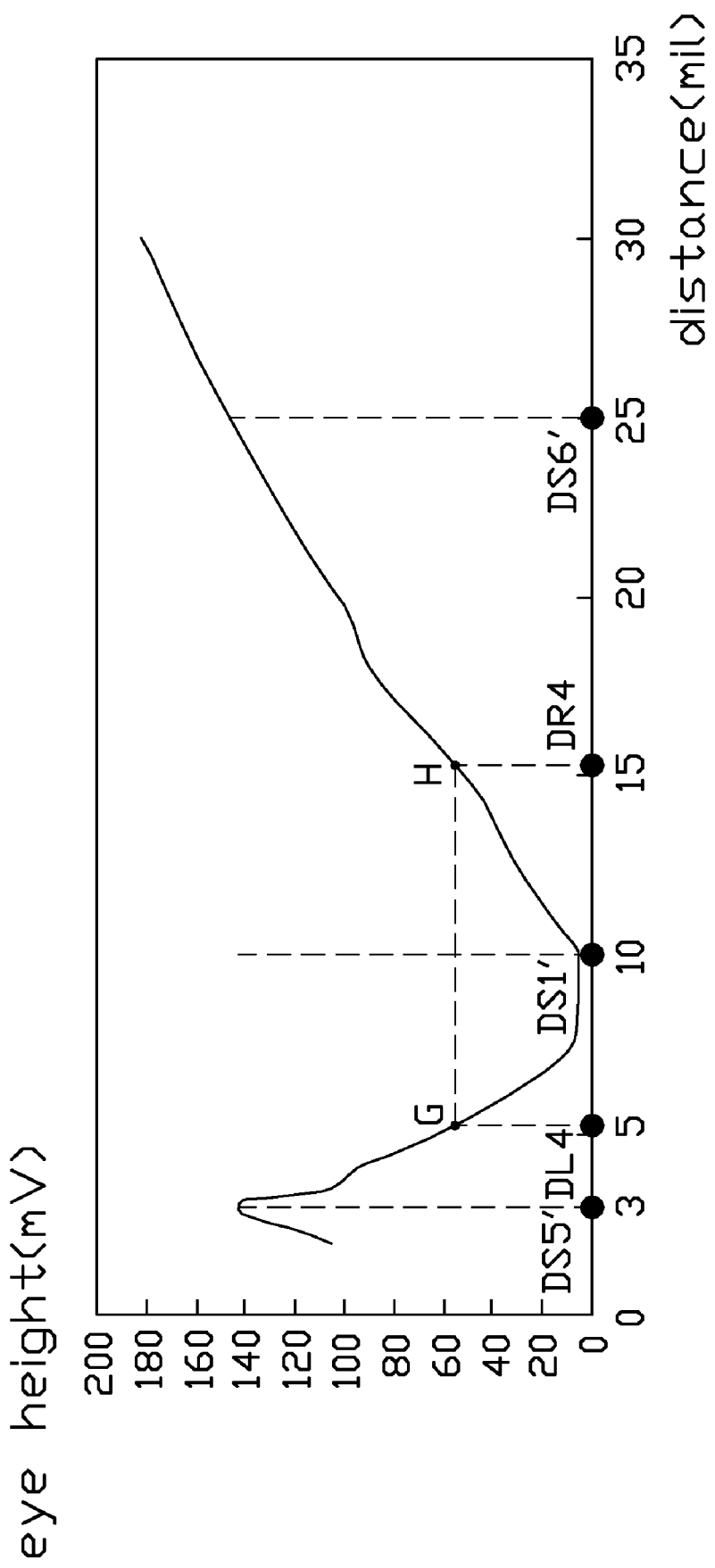
FIG.5 is an oscillographic trace showing a signal waveform of a relationship between the differential transmission lines distance and eye height in eye diagram, in accordance with another embodiment.

In another embodiment, W is 5 mil, T is 1.9 mil, L is 12 inch, S is 10 mil, H is 4.2 mil, and Tm is 0.7 mil. A dielectric constant of the signal layer 20 is 4.1, and a dielectric constant of the solder mask 40 is 3.4. Referring to FIGS. 4 and 5, in simulation, to obtain a signal waveform of relationship between the distance DS and eye width in eye diagram as shown in FIG.4, the distance DS is changed. In addition, a signal waveform of relationship between the distance DS and eye height in eye diagram as shown in FIG.5. Referring to FIG.4, the distance DS is capable of being set to a first distance DS1' which makes an eye width of the eye diagram to reach a minimum value. When the distance DS is greater or less than the first distance DS1', an eye width of the eye diagram increases. The distance DS is further capable of being set to a third distance DS3' less than the first distance DS1', which makes an eye width of the eye diagram to reach a maximum value. The distance DS is also capable of being set to a fourth distance DS4' greater than the first distance DS1' corresponding to an eye width equal to the eye width corresponding to the third distance DS3'. In one embodiment, the first distance DS1' is 10 mil, the third distance DS3' is 3 mil, and the fourth distance DS4' is 25 mil.

The signal waveform has a left threshold point E, and a right threshold point F. The left threshold point E corresponds to a left threshold distance DL3 of the distance DS. The right threshold point F corresponds to a right threshold distance DR3 of the distance DS. An eye width of the eye diagram corresponds to the left threshold point E meets requirements of the differential transmission lines 31 for the eye diagram. An eye width of the eye diagram corresponds to the right threshold point F meets requirements of the differential transmission lines 31 for the eye diagram. Eye widths of the eye diagram correspond to the other points between the left and right threshold points E, F do not meet requirements of the differential transmission lines 31 for the eye diagram. Therefore, the distance DS is set as a second distance less than or equal to the left threshold distance DL3, or greater than or equal to the third distance DS3'. In a typical layout method, the distance DS increases to, the fourth distance DS4' to increase the eye width. The simulation according to the set conditions shows that the layout space can be saved when the distance DS is set as the second distance. For example, when the third distance DS3' is set as the distance DS, a 22 mil layout space can be saved.

Referring to FIG.5, the distance DS is further capable of being set to a fifth distance DS5' less than the first distance DS1' which makes an eye height of the eye diagram to reach a maximum value. The distance DS is also capable of being set to a sixth distance DS6' greater than the first distance DS1' corresponding to an eye height equal to the eye height corresponding to the fifth distance DS5'. In one embodiment, the fifth distance DS5' is 3 mil, and the sixth distance is 25 mil.

The signal waveform has a left threshold point G, and a right threshold point H. The left threshold point G corresponds to a left threshold distance DL4 of the distance DS. The right threshold point H corresponds to a right threshold distance DR4 of the distance DS. An eye height of the eye diagram corresponds to the left threshold point G meets requirement of the differential transmission lines 31 for the eye diagram. An eye height of the eye diagram corresponds to the right threshold point H meets requirement of the differential transmission lines 31 for the eye diagram. Eye heights of the eye diagram correspond to the other points between the left and right threshold points G, H do not meet requirement of the differential transmission lines 31 for the eye diagram. Therefore, the distance DS is set as a second distance less than or equal to the left threshold distance DL4, or greater than or equal to the fifth distance DS5'. In a typical layout method, the distance DS increases to, the sixth distance DS6' to increase the eye height. The simulation according to the set conditions shows that the layout space can be saved when the distance DS is set as the second distance. For example, when the fifth distance DS5' is set as the distance DS, a 22 mil layout space can be saved.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board layout method comprising:
   providing a printed circuit board comprising a signal layer and a pair of differential transmission lines positioned on the signal layer;
   determining a first distance, wherein when a distance between the pair of differential transmission lines is greater or less than the first distance: an eye width and an eye height of an eye diagram obtained at output terminals of the pair of differential transmission lines increase; and
   setting a second distance, less than the first distance as a distance between the pair of differential transmission lines which makes the eye width and the eye height meet requirements of the pair of differential transmission lines for the eye diagram.

2. The method of claim 1, further comprising determining a third distance that is less than the first distance; and the second distance is greater than or equal to the third distance;

wherein when the distance between the pair of differential transmission lines is greater or less than the third distance, the eye width and the eye height of the eye diagram decreases.

3. The method of claim 2, wherein setting the second distance comprises the following steps: comparing a first second distance, corresponding to the eye width, with a second second distance, corresponding to the eye height; and setting the greater one of the first and second second distances as the second distance.

4. The method of claim 1, wherein when the distance between the pair of differential transmission lines is greater than the second distance, the eye width and the eye height of the eye diagram decrease; when the distance between the pair of differential transmission lines is less than the second distance, the eye width and the eye height of the eye diagram decrease.

5. The method of claim 1, wherein determining the first distance comprises the following steps: obtaining a signal waveform of a relationship between the distance between the differential transmission lines and the eye width or the eye height in the eye diagram; and determining the differential transmission lines distance corresponding to the minimum eye width or eye height as the first distance between the pair of differential transmission lines.

6. The method of claim 5, wherein obtaining the signal waveform comprises the following steps: coupling signal input terminals of the pair of differential transmission lines to a signal generator, and coupling signal output terminals of the pair of differential transmission lines to an oscillograph; generating signals of fixed frequency by the signal generator, and obtaining the signal waveform of eye diagram on the oscillograph.

7. The method of claim 5, wherein the signal waveform is a non symmetric parabola; the distance between the differential transmission lines corresponding to a bottom of the signal waveform is the right first distance between the pair of differential transmission lines.

8. A printed circuit board layout method comprising:
providing a printed circuit board with a signal layer, and a pair of differential transmission lines positioned on the signal layer;
obtaining a signal waveform of a relationship between the differential transmission lines distance and an eye width and an eye height in an eye diagram at output terminals of the differential transmission lines;
determining a left threshold point and a right threshold point on the signal waveform of eye diagram; wherein when the distance between the differential transmission lines is less than a left threshold distance corresponding to the left threshold point, the eye width and the eye height of the eye diagram increase; when the distance between the differential transmission lines is greater than a right threshold distance corresponding to the right threshold point, the eye width and the eye height of the eye diagram increase; and
setting a second distance less than or equal to the left threshold distance, or greater than or equal to the right threshold distance between the pair of differential transmission lines which makes the eye width and the eye height meet requirements of the differential transmission lines for the eye diagram.

9. The method of claim 8, further comprising determining a third distance less than the left threshold distance; wherein when the distance between the pair of differential transmission lines is greater or less than the third distance, an eye width and eye height of the eye diagram decrease; the second distance is greater than or equal to the third distance.

10. The method of claim 9, wherein setting the second distance comprises the following steps: comparing a first second distance corresponding to the eye width with a second second distance corresponding to the eye height; and setting the greater one of the first and second second distances corresponding to the eye width and eye height as the second distance.

11. The method of claim 9, wherein determining the third distance comprises the following steps: coupling signal input terminals of the pair of differential transmission lines to a signal generator, and coupling signal output terminals of the pair of differential transmission lines to an oscillograph; and generating signals of fixed frequency by the signal generator, and obtaining the signal waveform of eye diagram on the oscillograph.

12. The method of claim 11, wherein determining the third distance further comprising the following steps: obtaining a non symmetric parabola of relationship between the distance between the differential transmission lines and the eye width or the eye height in the eye diagram; and determining the distance between the differential transmission lines less than the left threshold distance corresponding to the maximum eye width or the maximum eye height as the third distance.

13. The method of claim 8, wherein when the distance between the pair of differential transmission lines is greater than the second distance, the eye width and the eye height of the eye diagram decrease; when the distance between the pair of differential transmission lines is less than the second distance, the eye width and the eye height of the eye diagram increase.

14. A printed circuit board layout method comprising:
providing a printed circuit board with a signal layer, and a pair of differential transmission lines positioned on the signal layer;
determining a right threshold distance between the pair of differential transmission lines which makes an eye width and an eye height meet requirements of the differential transmission lines for an eye diagram; wherein when the distance between the pair of differential transmission lines is greater than the right threshold distance, the eye width and the eye height of the eye diagram increase; when the distance between the pair of differential transmission lines is less than the right threshold distance, the eye width and the eye height of the eye diagram decrease; and
determining a second distance less than the right threshold distance between the pair of differential transmission lines which makes the eye width and the eye height meet requirements of the differential transmission lines for the eye diagram; and
setting the distance between the pair of differential transmission lines less than or equal to the second distance.

15. The method of claim 14, wherein when the distance between the pair of differential transmission lines is greater than the second distance or less than the right threshold distance, the eye width and the eye height does not meet requirements of the differential transmission lines for the eye diagram.

16. The method of claim 15, further comprising determining a third distance less than the second distance; wherein when the distance between the pair of differential transmission lines is greater or less than the third distance, the eye width and the eye height of the eye diagram decrease; the second distance is greater than or equal to the third distance.

* * * * *